RIGHT ANGLE SOCKET FOR ELECTRONIC DEVICES

Filed April 13, 1955

INVENTOR.
WILFORD J. BARNETT
BY Norman L. Chalfin
AGENT.

United States Patent Office 2,904,773

Patented Sept. 15, 1959

2,904,773

RIGHT ANGLE SOCKET FOR ELECTRONIC DEVICES

Wilford J. Barnett, Venice, Calif., assignor to Aerovox Corporation, a corporation of Massachusetts Application April 13, 1955, Serial No. 501,105

6 Claims. (Cl. 339—193)

My invention relates to sockets and in particular to a socket for electronic devices that may be mounted to a chassis at a right angle with respect to the plane of the chassis.

It is frequently desirable to mount an electronic part or a vacuum tube so that the central axis of the tube or part is in a plane parallel to the plane of the chassis or panel which contains an electronic circuit of which the vacuum tube or part is an element. Sockets have been marketed for specialized types of vacuum tubes for mounting the tubes to a chassis or panel but none have appeared for right angle attachment which can accommodate among other things the standard multipin vacuum tube. No component mounting sockets for chassis are available that may be mounted perpendicular to the plane of the chassis. I have devised a socket for vacuum tubes and electronic components which may be secured to a chassis or to a printed circuit assembly wherein the socket plane is at a right angle with the plane of the assembly and is so constituted that it may be readily used in conjunction with the dip-soldered type of printed circuit boards. To accomplish this I have provided a molded multipin socket body, tube pin receptacle clips especially adaptable to the structure of the socket body, a channelled supporting band and shield base structure which is wrapped about the socket body and is provided with mounting prongs that may be crimped over and soldered to circuit connection boards or chassis to support the socket body in a plane normal to the plane of the circuit board or chassis.

Accordingly it is an object of my invention to provide a socket for mounting components of electronic circuits so that the central plane of the component is parallel with the plane of the chassis.

It is another object of my invention to provide a socket for electronic components such as vacuum tubes or transistors adapted to be connected normal to a chassis.

It is a further object of this invention to provide a D-shaped multi-pin socket and mounting strap therefor whereby the socket may be mounted to a panel along the linear side of the D.

It is still another object of this invention to provide a new type of right angle mounting multi-pin socket with a novel pin clamping terminal connector.

It is yet another object of this invention to provide a new multi-pin socket assembly including a series of novel pin terminals, shield and mounting strap.

The above enumerated objects and other objects and advantages of my invention will become apparent in the following specification and claims taken together with the accompanying drawings in which:

In the assembly of electronic components to printed circuit panels, among others, it may be desirable to mount the sockets for tubes or other large elements to one side of the panel and smaller components such as resistors, capacitors and so forth, on the other side. In any event, if vacuum tubes were mounted in the usual fashion where the central axis of the tube is normal to the plane of the chassis, they project out a considerable distance. By mounting the tube socket so that the central axis of the tube is parallel with the plane of the chassis there is a space saving advantage to be gained.

Figure 1:
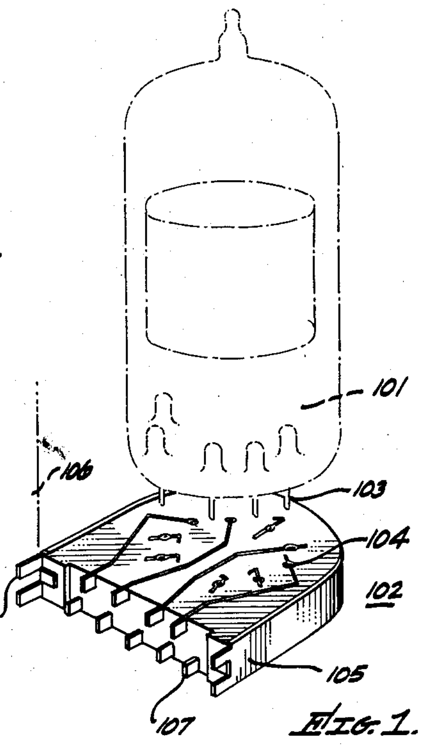
Fig. 1 is an overall perspective view of the socket of my invention.

In Fig. 1, I have shown a representative vacuum tube 101 in a position about to be plugged into a socket 102 constructed according to my invention. The pins such as 103 of tube 101 in the use position are inserted in the socket receptacles such as 104.

Socket 102 is D-shaped. A U-shaped strap 105 formed out of channel metal is provided to hold the socket 102 to a panel represented by the dashed-in structure 106. Terminal leads, such as 107, and mounting tabs, such as 108, are adapted to protrude through the panel for soldering connection to circuit elements and wires.

Figure 4:
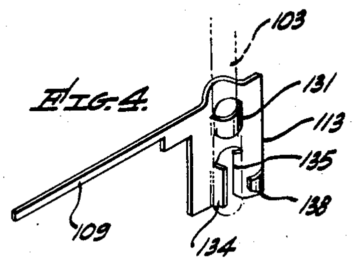
Fig. 4 is a sketch of an upper terminal lead and pin clamp assembly, a part of the socket of my invention.
Figure 5:
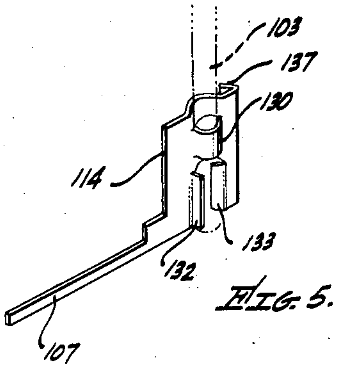
Fig. 5 is a sketch of a lower terminal lead and pin clamp assembly, a part of the socket of my invention.

In all of the figures of the drawings like reference numbers are given to like parts. Thus, in Fig. 2 the top view of the socket of my invention is shown wherein a circular array of pin receptacle depressions is provided such as the one shown at 104. A channel 110 is moulded in the socket base 102 from depression 104 to the straight edge of the D-shaped socket 102. Depression 104 and grooves 110 are provided to receive a pin clamp and lead-in strap such as shown in Fig. 4. Groove 110 is a part of the top surface of socket 102. Depression 111 is similar to groove 104 and is connected with groove 112. Connecting groove 112 is a part of the lower surface of the socket 102. The depressions 104 and 111 are provided with holes which go through the socket body 102 from the top to the bottom surface. The groove 110 is engraved or moulded in the top surface only deeply enough to accommodate lead in 109. Groove 112 is engraved in the lower surface and adapted to accommodate a pin clamp and lead such as shown in Fig. 5. The lead portions 109 or 107 of the pin clamp assemblies of Figs. 4 and 5 are bent to fit the shape of the grooves 110 or 112 respectively. The structure of socket base 102 shown at 139 eliminates moisture trappings which is undesirable in such apparatus. Electrically, moisture collecting in the area between adjacent conductors such as 115 and 119 would result in leakage or actual short circuiting of the potentials between these points.

Figure 2:
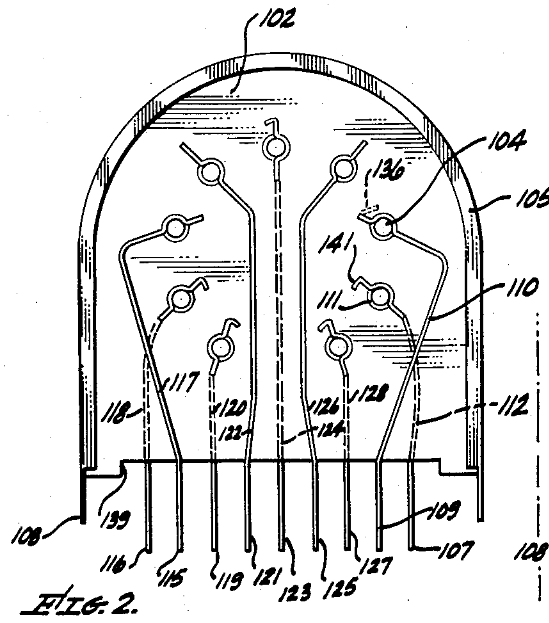
Fig. 2 is a drawing of the top view of my invention looking down on the pin receptacles and terminal grooves.
Figure 3:
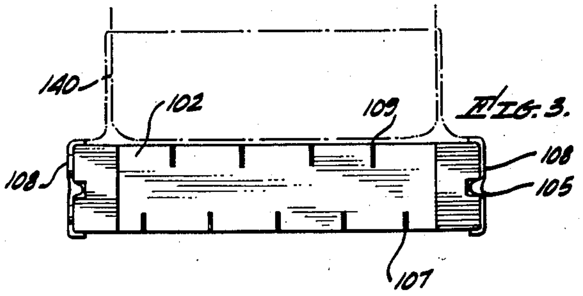
Fig. 3 is a linear end view of my invention looking at the terminal tabs and showing how an integral shield base may be made a part of the socket assembly.

In the Figs. 1, 2 and 3 a nine-pin socket commonly called the novel miniature is illustrated. This is intended to indicate an embodiment of my invention. The same elements in a suitable structure in accordance with my invention may be applied to a 5 pin or 7 pin or 8 pin socket or any other. Similarly for electronic components with 3 or 4 pins or more a similar configuration and structure may be used without departing from the intent and spirit of this invention. Terminals are brought out top and bottom in a configuration similar to that shown in the Figs. 1 and 2 and would terminate at the straight edge as shown in Fig. 3. Also shown in Fig. 3 is the shield base 140 which can be made an integral part with U-shaped strap 105.

Referring now to Fig. 2, it can be seen that terminal lead 109 in groove 110 connecting depression 104 which houses a tube pin contact clamp such as 113 of Fig. 4 appears in the top surface of the tube base 102. Terminal lead 107 is inserted in groove 112 connecting depression 111 which houses a tube pin contact clamp such as 114 of Fig. 5. The crossover of groove 110 and 112 in the upper and lower surfaces of the base respectively is arranged to reduce capacitance between the otherwise adjacent terminal leads 109 and 107. Terminal lead 116 is inserted in groove 118 in the lower surface of base 102 and is similar to lead 107 in groove 112. Terminal lead 115, in groove 117, is in the upper surface of base 102 and is similar to lead 109 in groove 110. Leads 119, 121, 123, 125 and 127 in their respective grooves 120, 122, 124, 126 and 128 can be seen to be alternately arranged in the upper and lower surfaces of the base 102.

I believe that the structure of the tube pin clamps used in my invention is unique. The electronic component contact pin clamps comprise the alternate structures shown in Figs. 4 and 5, which represent, as is evident, similar parts. Each contact pin clamp assembly comprises a contact lead such as 107 or 109, a guide such as 130 and 131, and clamping and cutting contact edges such as 132 and 133 or 134 and 135. Note that for the contact pin clamp of Fig. 4 which is adapted for insertion in the socket base from the top surface, the guide portion 131 is near the top, in line with the lead-in strap 109. The clamping and cutting edges 134 and 135 are arranged in line with the center line of the pin guide area 131 on the pendant portion 113 so that a pin 103 inserted in the contact pin clamp assembly of Fig. 4 is centered and held in line while the clamp edges 134 and 135 cut into and grip the tube pin for a positive contact. A locking tab 138 located at the lower extremity of the pendant clamp portion 113 is arranged to fit in and lock over a portion of groove provided therefor as shown at 136 (on the lower surface of socket 102).

The contact clamp assembly shown in Fig. 5 is adapted for insertion into the base 102 from the bottom surface of the base. Both of the contact pin clamp assemblies are arranged so that the tube pin is inserted in the contact pin clamp from the top surface of the base 102. Thus the guide surface 130 is still near the top of the contact pin clamp and the clamping edges 132 and 133 are near the bottom with the lead-in 107 in line with the contact clamping edges 132 and 133. The tube pin such as 103 shown dashed in Fig. 5 is thus centered and held in line while clamping edges 132 and 133 grip the tube pin for positive contact. A locking tab 137 located at the upper extremity of the clamp portion 114 is arranged to fit in and lock over a portion of groove provided therefor as shown at 141 on the upper surface.

To arrange each contact pin clamp assembly in its respective groove and contact receptacle of the tube socket 102 the lead-in strap such as 109 or 107 is bent into the appropriate shape.

I have described above the details of my invention of a multi-pin socket which may be mounted normal to a panel including the specialized tube contact pin clamping means which may be alternately inserted from top and bottom surfaces of the socket base to provide positive contact with a minimum of capacitance between each conductor lead of the terminal connections. While I have shown details of a nine-pin miniature socket, according to my invention, any number of pins and contacts may be employed in any necessary configuration without departing from the spirit and intent of my invention.

What is claimed as new is:

1. A socket for electronic components adapted to be mounted on a chassis at a right angle with respect to the plane of the chassis, said socket comprising: a molded base, said base having a linear edge and a circular edge connecting with both ends of said linear edge, said base having a plurality of depressions centrally arranged in a circle and a plurality of grooves, one of each of said grooves associated with and connecting one of each of said depressions with said linear edge and said grooves being alternately arranged in the upper and lower surfaces of said molded base; a channelled mounting strap; said strap being adapted to wrap around said circular edge of said molded base and having tabs protruding at each end for insertion into the chassis; and a plurality of contact pin clamps, each of said clamps having a lead-in strap and a plate at one end of said strap, arcuate spring fingers forming a semi-circular pin receptacle adjacent one end of said plate, and a pair of knife edge contactors projecting from said plate and in line with, said arcuate spring fingers at the opposite end of said plate therefrom, said contact pin clamps being inserted in said molded base alternately from top and bottom thereof, said lead-in straps being inserted in said grooves with the free end of said straps extending beyond said linear edge, and said arcuate spring fingers and said projecting knife edge contactors being inserted in said depressions.

2. A socket adapted to be mounted on a panel at a right angle with respect to the plane of the panel, said socket comprising: a D-shaped base, said base having a plurality of openings centrally arranged in a circle and a plurality of grooves, said grooves connecting said openings with the straight edge of the D, said grooves being alternately arranged in the top and bottom surfaces of said base; a channeled mounting strap wrapped around the circular edge of said D-shaped base and having protruding tabs at each end for insertion into the panel; and pin-contacting clamps including a lead-in strap and a plate at one end of said strap, arcuate spring fingers forming a pin receptacle adjacent one end of said plate, and a pair of knife-edge contactors projecting from and in line with said arcuate spring fingers at the opposite end of said plate therefrom, said pin-contacting clamps being inserted in said base alternately in said grooves in said top and bottom surfaces thereof, with the free end of said lead-in straps extending beyond the straight edge of the D to form terminal connections, said arcuate spring fingers with said knife-edge contactors being inserted in said openings.

3. A metal-contacting insert for an insulative socket body for making contact between an electrical circuit and a terminal pin inserted in said socket body, said insert comprising: a generally rectangular plate having arcuate fingers oppositely positioned in the center of and near one edge of said plate and forming a semi-circular receptacle for a terminal pin; knife-edge contactors projecting from said plate in opposite directions in alignment with said arcuate fingers, said contactors being positioned at the opposite edge of said plate from said fingers; a lead-in strap being coplanary attached to said plate at one corner thereof; and a locking tab being attached at the diagonally opposite corner thereof, said locking tab being bendable after insertion of said metal insert into said socket to lock said insert in place, said lead-in strap projecting beyond the outer edge of said socket body.

4. A metal-contacting insert for an insulative socket body for making contact between an electrical circuit and a terminal pin inserted in said socket body, said insert comprising: a generally rectangular plate having arcuate fingers oppositely positioned in the center and near one edge of said plate and forming a guide and receptacle for a terminal pin; knife-edge contactors projecing from said plate in opposite directions and in alignment with said arcuate fingers, said contactors being positioned at the opposite edge of said plate from said fingers; a lead-in strap being connected to said plate at the end thereof having the arcuate fingers; and a locking tab diagonally opposite said lead-in strap at the end of said plate having said knife-edge contactors.

5. A metal-contacting insert for an insulative socket body for making contact between an electrical circuit and a terminal pin inserted in said socket body, said insert comprising a generally rectangular plate having arcuate fingers oppositely positioned in the center and near one edge of said plate and forming a receptacle for a terminal pin; knife-edge contactors projecting from said plate in opposite directions and in alignment with said arcuate fingers, said contactors being positioned at the opposite edge of said plate from said fingers; a lead-in strap being connected in a common plane to said plate at the end thereof having said knife edge contactors; and a locking tab diagonally opposite said lead-in strap at the end of said plate having said arcuate fingers.

6. In a right angle socket for electronic components a contact pin clamp comprising: a lead-in strap and a plate attached to one end of said strap, said plate having arcuate spring fingers forming a semi-circular pin guide and receptacle adjacent one end of said plate; and a pair of knife-edge contactors projecting from and in line with said arcuate spring fingers at the other end of said plate.

References Cited in the file of this patent

UNITED STATES PATENTS

| | | |
|---|---|---|
| 1,774,646 | Goudy | Sept. 2, 1930 |
| 1,964,541 | Soreney | June 26, 1934 |
| 2,288,940 | Curtis | July 7, 1942 |
| 2,550,237 | Franklin | Apr. 24, 1951 |
| 2,613,244 | Del Camp | Oct. 7, 1952 |

FOREIGN PATENTS

| | | |
|---|---|---|
| 704,658 | Great Britain | Feb. 24, 1954 |